United States Patent
Sprague

[19]

[11] Patent Number: 6,072,645
[45] Date of Patent: Jun. 6, 2000

[54] METHOD AND APPARATUS FOR RETROACTIVE RECORDING USING MEMORY OF PAST INFORMATION IN A DATA STORAGE BUFFER

[76] Inventor: Peter J Sprague, 399 Undermountain Rd, Lenox, Mass. 02140

[21] Appl. No.: 09/013,623

[22] Filed: Jan. 26, 1998

[51] Int. Cl.⁷ ...................................................... G11B 5/00
[52] U.S. Cl. .................................................................. 360/5
[58] Field of Search .............................. 360/5, 7, 61, 69; 369/7

[56] References Cited

U.S. PATENT DOCUMENTS

| | | |
|---|---|---|
| 2,819,940 | 1/1958 | Sorrells . |
| 3,053,427 | 9/1962 | Wasserman . |
| 3,459,901 | 8/1969 | Cooper . |
| 3,482,230 | 12/1969 | Girling . |
| 3,682,363 | 8/1972 | Hull . |
| 3,891,970 | 6/1975 | Brotz . |
| 3,942,190 | 3/1976 | Detwiler . |
| 3,965,483 | 6/1976 | Katoh et al. . |
| 4,123,787 | 10/1978 | Leclerc du Sablon . |
| 4,628,327 | 12/1986 | Anderson et al. . |
| 4,982,390 | 1/1991 | Tanaka . |
| 5,282,092 | 1/1994 | Wilhelms . |
| 5,345,430 | 9/1994 | Moe . |
| 5,477,487 | 12/1995 | Greenberg . |

*Primary Examiner*—W. Chris Kim
*Attorney, Agent, or Firm*—Allan Jacobson

[57] ABSTRACT

A retroactive recording device, having a main recording medium, temporarily stores past information in a memory. In particular, an audio tape recorder includes a solid state retroactive memory which is operated continuously to temporarily store a past time interval of digital audio information. To begin retroactive recording, all or a portion of the past information stored in the retroactive memory is transferred to the recording medium. After transferring the desired past information, recording is continued in real time. In one embodiment, where the recording medium is a magnetic audio tape, temporarily stored past information is transferred to the audio tape by operating the audio tape transport mechanism at a higher than normal speed so as to catch up to present time. In another embodiment, where the recording medium is a non-volatile memory, temporarily stored past audio information is transferred to the non-volatile memory, and the present recording is continued in real time.

7 Claims, 4 Drawing Sheets

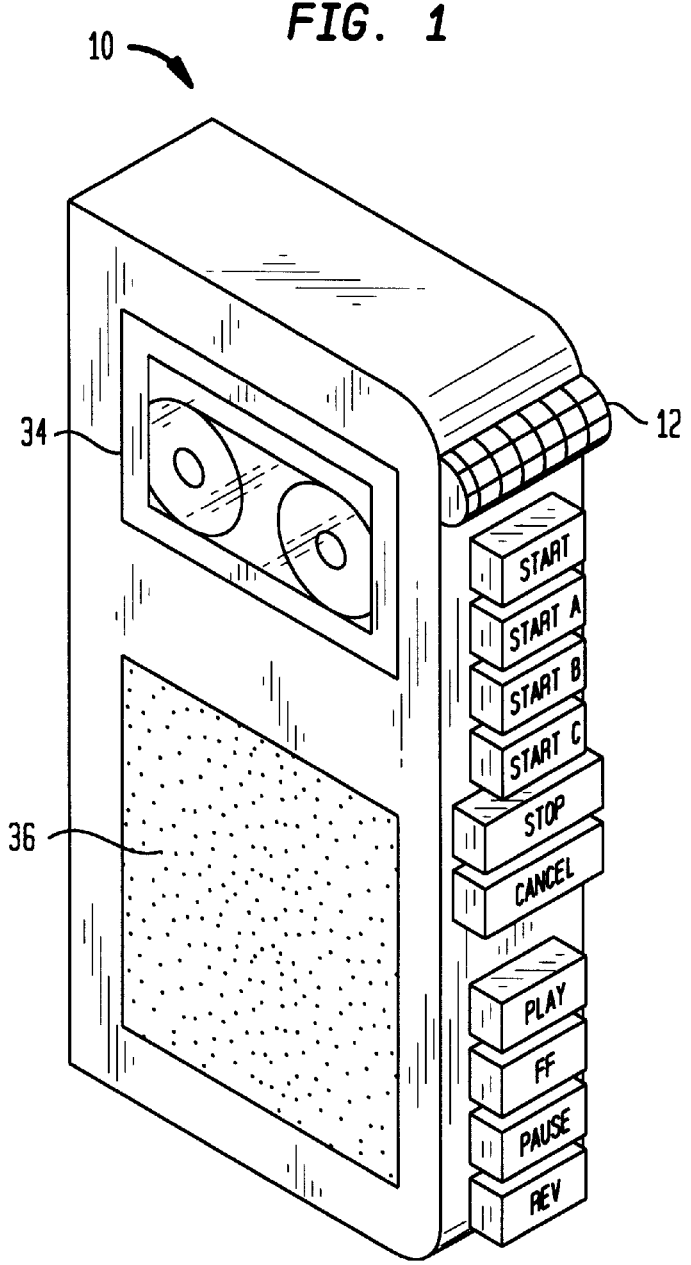
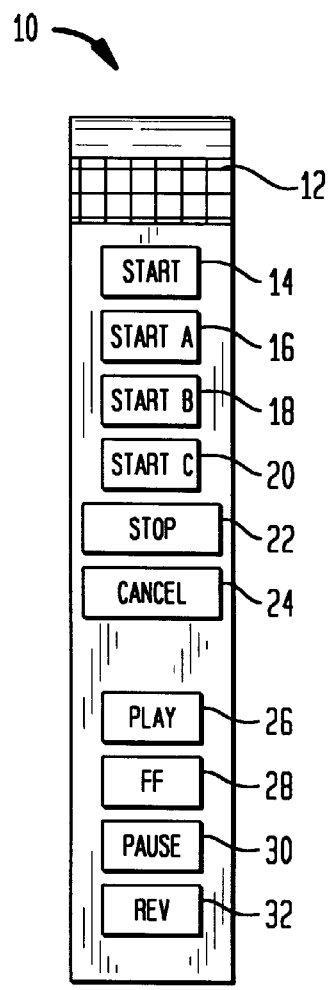

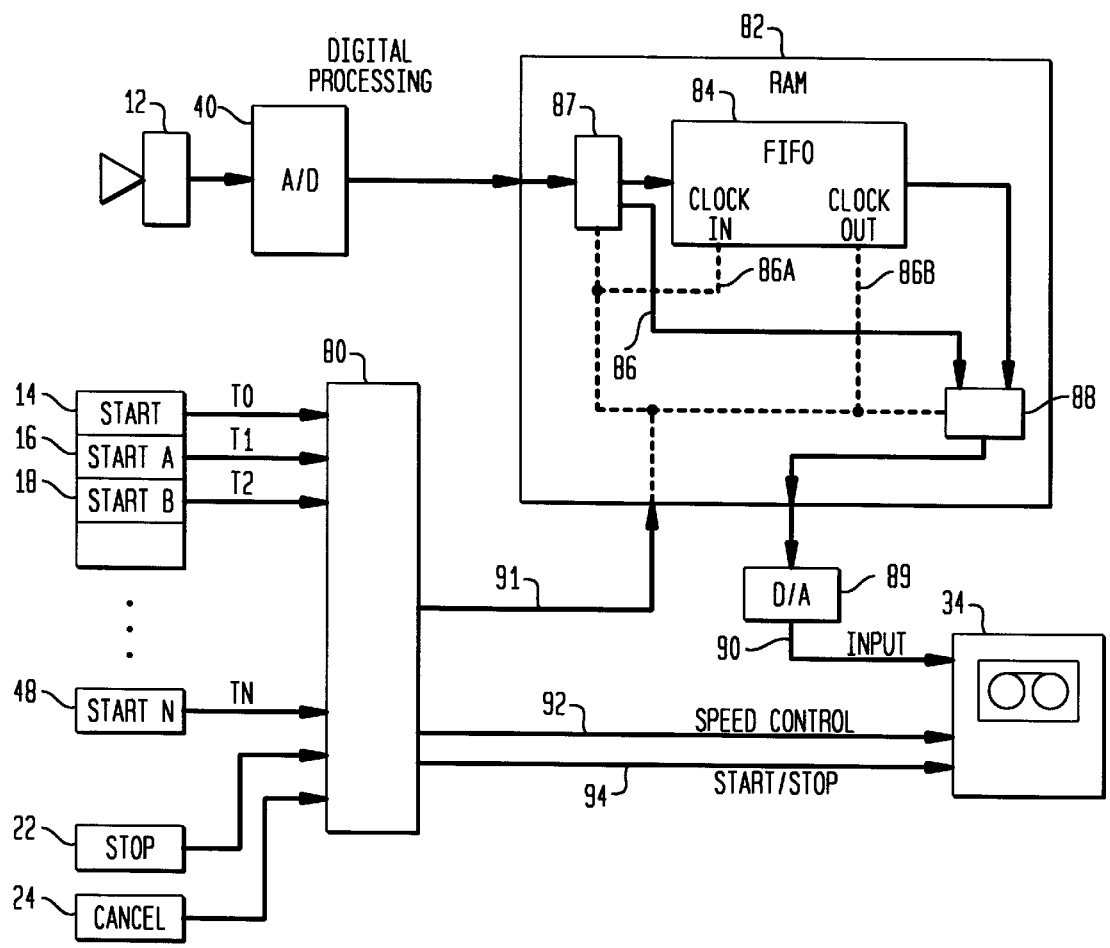

METHOD AND APPARATUS FOR RETROACTIVE RECORDING USING MEMORY OF PAST INFORMATION IN A DATA STORAGE BUFFER

FIELD OF THE INVENTION

The present invention relates to the field of recording devices. More particularly, the present invention relates the field of continuously monitoring recording devices.

BACKGROUND OF THE INVENTION

Some recording devices are operated continuously. One example is a video surveillance camera. Every movement or sound that the camera sees and hears is recorded on tape. Another example is a court transcription recorder. However, continuous recording imposes the burden of providing continuous power to the tape transport. In addition, continuous recording may further require dual tape transports to assure that no gap is recording is caused by changeover from one tape to the next. Instant replay tape recorders are known. Instant replay devices typically use multiple read/write tape heads spaced along a single magnetic tape, to provide instant replay of a past program segment without losing any program material as the new program is being recorded in real time.

Most recording devices however, such as an audio tape recorder or a VCR, are not operated continuously, but are turned on when needed. The disadvantage of turning on the recording device on when needed, is that a recordable event may be missed because the recorder was turned on too late. In the case of a VCR, the beginning portion of a movie, concert or show may be missing from the VCR tape. In the case of a voice recorder, desired portions of a conversation are missed as a result of the recorder not being turned on when the conversation began.

Manufacturers have included features which address the problem of starting the recorder in a timely fashion. One such special feature is VCR programming by which a VCR is programmed to start and stop at a certain time in the future. However, VCR programming depends on the availability of published programming schedules which are not available for music selections broadcast by radio. Another related special feature is the instant record button, which provides a "one touch" start function to place the recording device in the recording mode, and start the tape transport. While an instant record button reduces the problem of missing portions of recordings, it does not eliminate it.

SUMMARY OF THE INVENTION

The present invention is embodied in a recording device in which the recent past is temporarily recorded in a memory. The user selects a start time which can be retroactive, i.e., can be either the present time or a past point in time. The number of minutes into the past which can be selected by the user is determined by the size of the memory. For example, in an audio recorder, the present invention creates the ability to retroactively record the past 1 to 5 minutes of a conversation.

The recording unit continuously stores a few minutes of past audio in a low power solid state memory. The microphone and memory are enabled even when the recording unit is turned off and the tape is not running. Audio is stored continuously in a process that combines an audio compression chip with a dynamic random access memory (DRAM) memory chip. The memory chip would be about 1-4 megabits and be low cost.

Only the most recent audio data is temporarily stored. For example, if the capacity of the DRAM chip is roughly 5 minutes of voice quality audio, then as new material is added, the material older than 5 minutes is dropped from the memory. If, during a conversation, the human auditor heard an excellent joke, a brilliant aphorism or a good idea, that comment could be transferred to the tape by pushing a button 1 to 5 times with each push representing a 1 minute increment. For example, a single push transfers 1 minute worth of prerecorded contents from the chip to the tape, 2 pushes transfers 2 minutes worth of prerecorded contents from the chip to the tape. In an alternative embodiment, the recorder has a group of control buttons, each button selecting one of a predetermined number of minutes of desired retroactive recording, from 1 to 5 minutes.

In such manner, an audio recorder is started "retroactively," that is, enabling a user to record what was previously said, without requiring the speaker repeat the statement, nor relying on human memory to determine what was said. In the case of recording broadcast music, the tape can be started after the musical piece has begun, and still capture the entire musical piece.

Thus, the present invention is embodied in a recording method and apparatus for retroactive recording of past information. A recorder typically includes an information sensor and a recording medium. The information signal may be in analog or digital form, and the recording medium may be solid state such as a flash memory module, or mechanical such as a tape transport. In accordance with the present invention, an information recorder further includes a retroactive memory which is operated continuously to temporarily store a past interval of information. When the operator desires to begin recording retroactively, all or a portion of the past information stored in the memory is transferred to the recording medium. After transferring the desired past information, recording is continued in real time.

In one embodiment of the present invention, for an audio tape recorder, when retroactive tape recording is initiated, the temporarily stored past information is transferred to an audio tape by operating the audio tape transport mechanism at faster than normal speed (the real time rate) so as to catch up to present time. After the tape mechanism catches up to the present time, recording continues in real time. During the transfer from the retroactive memory to the audio tape, the audio signal from the microphone is further recorded in the memory chip so that there is no interruption of the recording process.

In another embodiment of the present invention, when retroactive tape recording is initiated, the temporarily stored past information is transferred to the audio tape at normal speed. Subsequent audio information from the microphone is stored in the retroactive memory chip, also in real time. The audio tape transport operates for a time interval after the tape recorder is stopped, in order to complete the recording of past audio information plus the subsequent audio information. In such manner, the past audio information and the subsequent audio information is recorded on the audio tape at normal speed, but with a delay equal to the time interval of the past audio information.

In yet another embodiment of the present invention, in which the recording unit records audio information in a main solid state memory, the recording unit further includes an additional solid state temporary memory, (which may also be a designated portion of the main solid state memory), which temporary memory is operated continuously to temporarily store a past interval of audio information. When retroactive tape recording is initiated, the temporarily stored past information is transferred to the main solid state memory to form part of the desired audio recording without interruption of the recording process.

BRIEF DESCRIPTION OF THE FIGURES

FIG. 1 is an isometric drawing of a recording device in accordance with the present invention.

FIG. 2 is diagram showing the layout of the control buttons of a recording device in accordance with the present invention.

FIG. 3 is a block diagram of a recording device in accordance the present invention.

DETAILED DESCRIPTION

Figure 4:
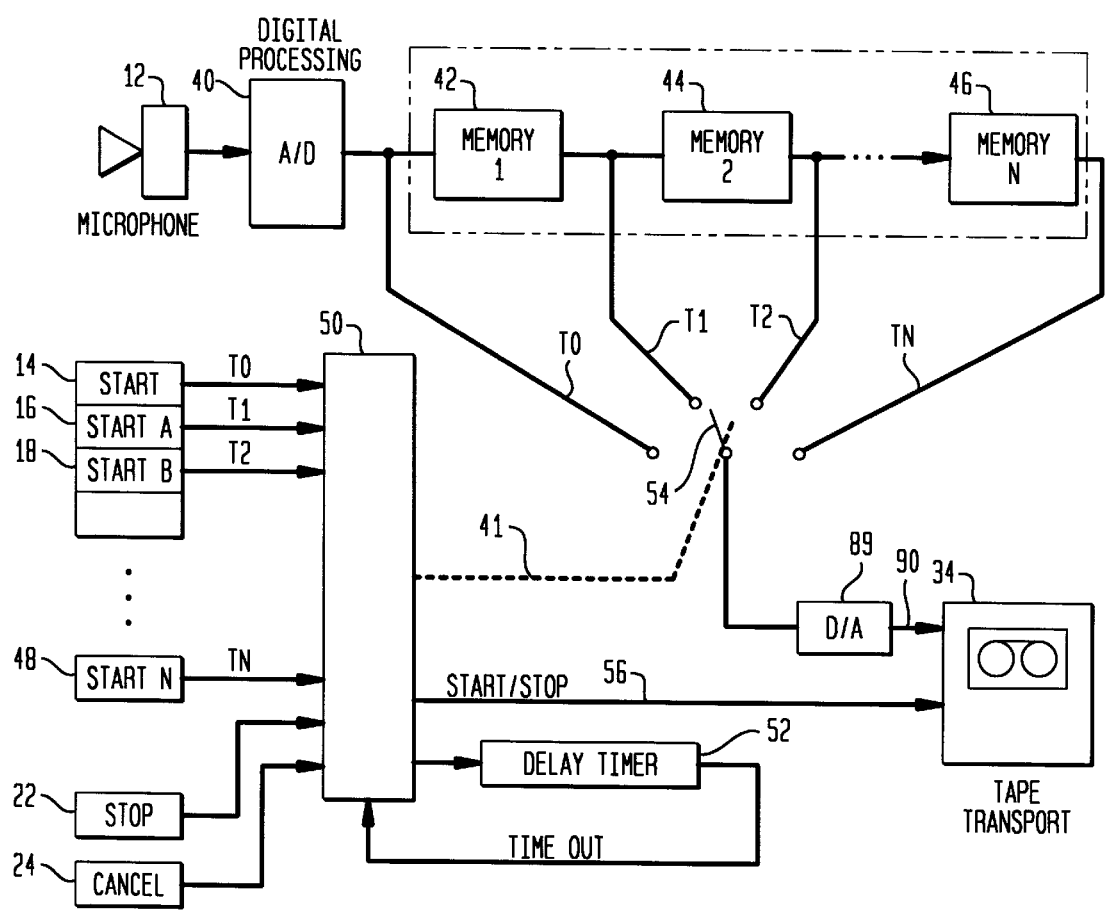
FIG. 4 is block diagram a first alternate embodiment of a recording device in accordance with the present invention.

As shown in FIG. 1, tape recorder 10 includes a microphone 12, speaker 36 and tape transport mechanism 34 including a recording head. The control buttons of the tape recorder are shown in FIG. 2. The control buttons include playback control buttons consisting of play 26, pause 30, fast forward 28 and reverse 32. In addition, the control buttons include a recording start control button 14, and retroactive recording start control buttons 16, 18, 20, 22, 24. Automatic functions include voice operated startup when in recording mode, and automatic reverse and shut off at the end of tape during playback mode. An on/off switch (not shown) to completely inactivate the tape recorder functions is provided.

The retroactive controls include three retroactive start control buttons consisting of retroactive start button A, 16, retroactive start button B, 18 and retroactive start button C, 20. A stop control button 22 and a recording cancel button 24 provide for retroactive recording control as described in further detail below.

A block diagram of a retroactive recorder embodying the present invention is shown in FIG. 3. For clarity, playback functions of the retroactive recorder have been omitted. A microphone 12 is coupled to a digital processing circuit 40, which digitizes and compresses the incoming audio signal to digital form. Digital processing circuit includes an analog to digital converter (A/D). The output of the digital processing circuit 40, which consists of compressed digital audio data samples, is coupled to the input of a random access memory 82 (RAM). The output of the memory 82 is coupled via a digital to analog (D/A) converter 89 to the input 90 of the recording head on the tape transport 34.

A controller 80 receives control button inputs 14, 16, 18, 48, 22, 24, and generates a speed control signal 92 and a start/stop control signal 94 to the drive motor of the tape transport mechanism 34. For example, speed control signal 92 may direct the tape transport 34 to operate at either 1.2 inches per second or 2.4 inches per second. In addition, control signals 91 from logic controller 80 direct the internal and external data flow within the memory 82 via logic control gates 87 and 88.

The RAM memory chip 82 is organized according to the programming of controller 80 to be the functional equivalent of a first in, first out (FIFO) buffer, shown schematically as FIFO 84. Logic control gate 87 switches the input data responsive to controller 80, to either store input data from digital processing circuit 40 in FIFO 84, or to couple input data from digital processing circuit 40 to logic control gate 88 via conductor 86. Logic control gate 88 switches the output data responsive to controller 80, to either direct the output data from FIFO 84 to the D/A converter 89, or couple input data from logic control gate 87 and conductor 86 to D/A converter 89. In the alternative, FIFO 84 and logic control gates 87, 88 may be implemented in a dedicated chip.

The analog output of the D/A converter 89 is coupled to the recording head input 90 of the tape transport 34. FIFO 84 has separate clock in and clock out terminals, 86A and 86B respectively, for independent control over input and output data rates. FIFO 84 holds digital audio samples which are clocked in 86A or out 86B at a real time rate. In particular, the data output from FIFO 84 may be clocked out 86B at a higher than real time rate.

In operation, with the tape recorder 10 turned on, the system is in a quiescent listening mode. The tape transport 34 drive motor is stopped. The microphone 12, digital processing circuit 40, controller 80 and memory 82 are active. Compressed digital audio data samples at the output of digital processing circuit 40 are coupled through control gate 87 for storage in FIFO 84 which functions as a real time audio buffer.

New compressed digital audio data samples accumulate in FIFO 84. When the FIFO 84 buffer is full, further input of additional compressed digital audio data samples causes the oldest stored compressed digital audio data sample to shift beyond the data storage capacity of FIFO 84, and be lost. Thus, FIFO 84 holds compressed digital audio data samples representing the most recent past audio reaching the tape recorder microphone 12. Typically, FIFO 84 holds the past 5 minutes of audio.

Normal recording mode is entered by pressing start button 14. Controller 80 conditions control gates 87 and 88 to direct input digital data from the output of digital processing circuit 40 to the D/A converter 89. The output of the D/A converter 89 is input 90 to the recording head of the tape transport 34. The controller 80 starts the tape transport 34 via control line 94 and the tape recorder begins recording current audio in real time. In normal recording mode, the recorder starts at present time and records present audio.

Retroactive recording mode is entered by pressing one of the retroactive recording control buttons, START A, 16, START B, 18 or START C, 20. By way of example, START A represents 1 minute, START B represents 3 minutes and START C represents 5 minutes. For START A, FIFO 84 is clocked out 86B so that FIFO 84 holds the past 1 minute of audio. The other 4 minutes of compressed digital audio data is discarded. For START B, FIFO 84 is clocked out 86B so that FIFO 84 holds the past 3 minutes of audio. The other 2 minutes of compressed digital audio data is discarded. For START C (5 minutes of retroactive recording), it is not necessary to clock and discard any data FIFO 84.

In general, FIFO 84 is clocked out 86B to the desired retroactive starting point, TN, at the maximum output clock rate so as to position the desired data in FIFO 84 to the output side of the FIFO stack as quickly as possible. During output clocking to position the desired FIFO data at the output of the FIFO, input data is continued to be clocked in 86A to FIFO 84 at a real time rate.

When the desired retroactive audio data is positioned at the output of FIFO 84, controller 80 starts the tape transport 34 via control line 94, and the recorder begins recording past audio from memory FIFO 84. In order to catch up to real time recording, the tape transport 34 is run at higher than normal speed, and FIFO 84 output is clocked out 86B at higher than normal speed. While FIFO 84 is being clocked out, new real time digital audio data is being clocked in 86A to FIFO 84.

After the desired past audio is clocked out of FIFO 84 and recorded on the audio tape, FIFO 84 still holds compressed digital audio samples accumulated since the retroactive recording button TN was pressed. From this point, FIFO 84 output continues to be clocked out 86B at a higher than normal speed until FIFO 84 is empty.

Since the stored compressed digital audio data samples from FIFO 84 are clocked out at a higher rate than the input to FIFO 84 (digital audio from the digital processing circuit 40 is clocked in 86A at a normal real time rate), FIFO 84 will tend to empty out. When FIFO 84 is empty, the recording has caught up to present time. The controller 80 then reduces the tape transport speed to normal and begins clocking the output 86B from FIFO 84 at normal speed.

The tape recorder is now at normal speed in a recording mode. However, as a result of using one of the retroactive recording start buttons, a portion of the audio which occurred prior to the start of the tape recorder is recorded on the tape. The stop button 22 is used to stop the tape after it has recorded audio up to the time the stop button 22 had been pushed. If the past stored audio information has not been fully recorded, the tape transport mechanism 34 may continue to operate for a period of time after the stop button is pressed. The cancel button 24 is used to abort the recording immediately, regardless of whether or not the tape recording has caught up to the present time.

The stop 22 and cancel 24 buttons provide flexible recording options. To record only a past clip of audio, a start button 16, 18, 48, is pressed, followed by the stop button 22. Only the past audio clip will be captured on the audio tape.

To record a past clip of audio and continue recording the present audio, a retroactive start button 16, 18, 48 is pressed. The stop button 22 is not pressed and recording continues. When it is no longer desired to record further present audio, the stop button 22 is then pressed. The cancel 24 command aborts recording, and optionally, rewinds the tape to the point where retroactive recording began before the start 16, 18, 48 button was pressed.

FIFO 84 may be implemented using any one of a number of chip technologies, including standard cell ASIC's, gate arrays, programmable logic arrays, and the like. As indicated, a general purpose semiconductor random access memory (RAM) may also be organized to emulate a FIFO, by creating stack registers and address pointers in memory, under the control of a microprocessor or logic controller 80 to be equivalent of FIFO 84. Since the memory 82 is continuously operated to monitor the recent past audio information, it is preferable to use a solid state semiconductor device for reliability and low power consumption.

Alternate embodiments

An alternate embodiment of the present invention in which the tape transport mechanism always runs at normal speed is shown in FIG. 4. Instead of running the tape mechanism 34 at a faster than normal speed in order to transfer the content of memory to the tape more quickly than real time, the alternate embodiment of FIG. 4 uses a real time serial memory to transfer past audio to the tape. The originally selected retroactive start time is maintained as a recording delay through the recording.

In FIG. 4, the past audio, in the form of compressed digital audio data samples is stored in serial data memories 42, 44, 46 which form a shift register. Series connected memories 42, 44 and 46 may be implemented by shift register memories, or equivalent structures in random access memory (RAM) using stack registers and address pointers. A memory segment selection switch 54 (shown schematically in FIG. 4), under the control 41 of controller 50 selects a tap point in the serial shift register formed by memories 42, 44 and 46.

Selection switch 54, when set to position T0 by controller 50, selects the compressed digital audio data samples at the output of digital processing circuit 40 which represent present audio in real time. In any of the other positions T1, T2 or TN, selection switch 54 selects a tap point accessing the compressed digital audio data samples at the output of one of memory 42, memory 44 or memory 46, which output represents past stored audio information, also in real time. The selected tap point, (TN in the general case), is selected by switch 54 and coupled to D/A converter 89 which provides analog output to the recording head input 90 for recordation on the audio tape. A delay timer 52 is provided which receives an initial value from controller 50, and provides a time out signal back to controller 50. The delay timer 52 allows controller 50 to measure a desired real time interval. Controller 50 also provides start/stop control signals 56 to the tape transport mechanism 34.

In operation, the compressed digital audio data samples at the output of digital processing circuit 40 are stored in memories 42, 44, 46. After memories 42, 44, 46 are full, the arrival of each new additional compressed digital audio data sample at the first memory 42 causes the oldest stored compressed digital audio data sample in memory 46, to shift beyond the data storage capacity of memory 46 and be lost. Thus, memories 42, 44, 46 hold compressed digital audio data samples representing past audio reaching the tape recorder microphone 12. By way of example, the memories 42, 44 and 46 may each hold a 1 minute segment of past audio.

When any of the start buttons 14, 16, 18, 48 are pressed, the controller 50 starts the tape transport 34 via control line 56 and the tape recorder begins recording audio at normal speed. To record present real time audio, start button 14 is pressed, and the controller 80 conditions control switch 54 to direct input digital data from the digital processing circuit 40 to the D/A converter 89 and the recording head input 90 of the tape transport 34.

When one of the retroactive recording control buttons, START A, 16, or START B, 18, is pressed, the controller 50 starts the tape transport 34 via control line 56 as before. However, in contrast to recording present real time audio, the tape recorder begins recording past audio from memory, in delayed real time. The amount of recorded past audio depends on the particular start button pressed. For example, START A (corresponding to beginning recording at a prior time interval of T1, sets switch 54 to tap point T1. START B (corresponding to beginning recording at a prior time interval of T2), sets switch 54 set to tap point T2. In the general case, START N (corresponding to beginning recording at a prior or retroactive point in time TN) causes controller 50 to set switch 54 set to tap point TN.

When the stop button 22 is pressed, the tape transport 34 does not stop immediately. Instead, the controller 50 sets the delay timer 52 to the value of the prior time interval selected, T1, T2 or TN. The delay timer 52 counts down to zero, and sends a time out signal back to the controller 50. The purpose of the delay timer 52 is to permit the tape transport 34 to operate for a time interval T1, T2 or TN after the tape recorder is stopped in order to complete the recording of both past audio information plus the subsequent audio information. In such manner, the past audio information and the subsequent audio information is recorded on the audio tape at normal speed, but with a delay equal to the time interval of the retroactive (past) audio information. When the cancel button 24 is pressed in lieu of the stop button 22, controller 50 stops the tape transport mechanism immediately, aborting any further recording.

In yet another alternative embodiment, the multiple delay start time buttons 16, 18, 20 may be replaced by a single button selection arrangement. In the one button arrangement, a single retroactive start button is provided. The single button delay is pushed once for each minute of desired retroactive recording. That is, the single delay start button is pushed once for one minute, twice for two minutes, three times for three minutes, etc. In the embodiment of FIG. 4, each push of the button (within a prescribed time interval) would condition switch to select 54 a different tap of the serial data shift register memory 42, 44, 46 for recording on the tape.

To implement the single button arrangement, a counter counts the number of times the single button is pressed within a predetermined time. A selection circuit is responsive to the contents of the counter circuit to select a respective predetermined portion of the memory (shift register memory 42, 44, 46 in FIG. 4, or RAM 82 in FIG. 3) for transfer to the recording medium in the tape transport 34.

Other forms of recording devices may be substituted for the magnetic tape, such as a magnetic floppy disk or an optically writeable CD. A block diagram of a second alternate embodiment of a recording device in accordance with the present invention which includes a solid state memory in place of the magnetic tape and mechanical tape mechanism, is shown in FIG. 5.

Figure 5:
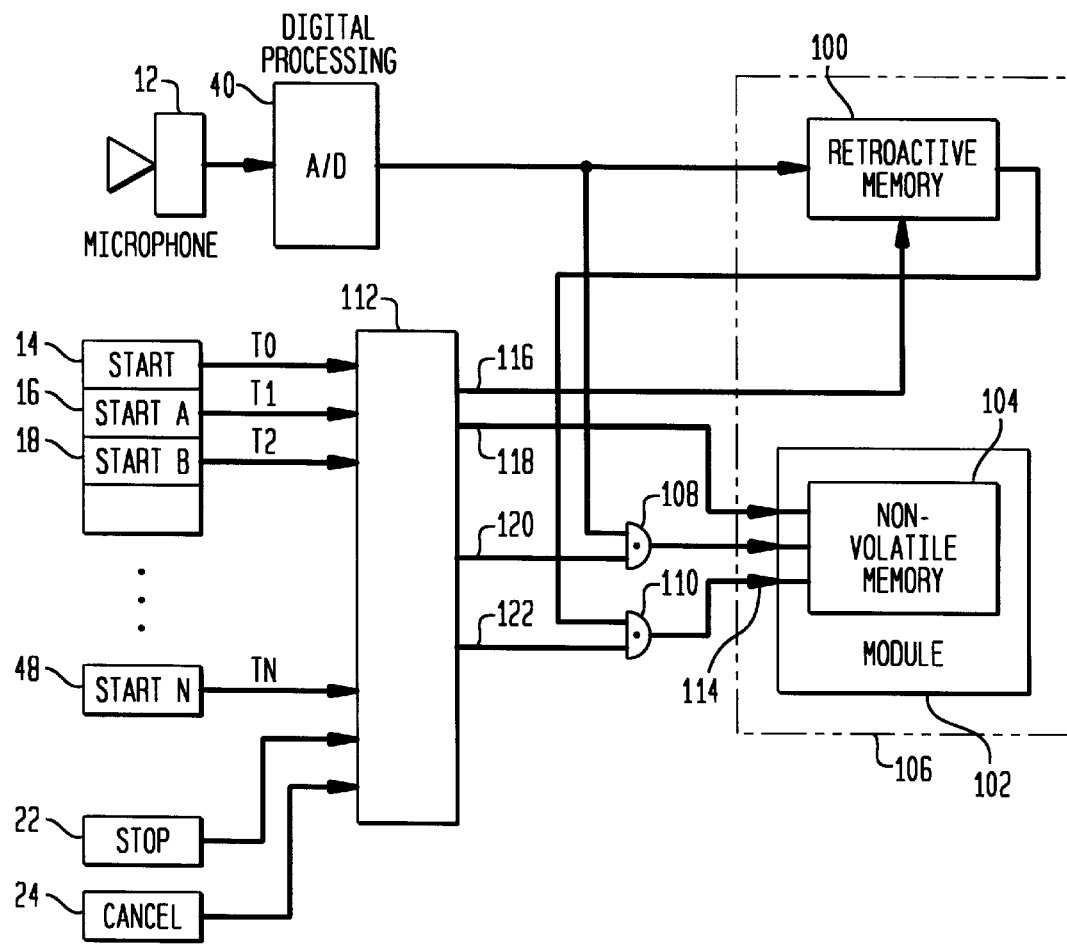
FIG. 5 is block diagram a second alternate embodiment of a recording device in accordance with the present invention which includes a solid state memory in place of mechanical tape mechanism.

In FIG. 5, a retroactive memory 100 temporarily stores a recent past interval of audio information. The main recording medium for the retroactive recorder is a non-volatile memory 104. Non-volatile memory 104 may be a true non-volatile memory or a battery backed up volatile memory to form the equivalent of a non-volatile memory. The retroactive recording memory 100 may be either volatile, nonvolatile or a battery backed up type of memory.

The input of the retroactive memory 100 is coupled to the compressed digital audio output of the digital processing circuit 40, which is also coupled to one input of AND gate 108. The output of the retroactive memory 100 is coupled to one input of AND gate 110. Controller 112 receives control button inputs 14, 16, 18, 48, 22, 24, and generates two recording control signals 116 and 118. Recording control signals 116 enable retroactive memory 100. Recording control signals 118 enable non-volatile memory 104.

Controller 112 also generates two data control signal 120 and 122. Data control signal 120, to one input of AND gate 108, enables data input to non-volatile memory 104 from the output of digital processing circuit 40. Data control signal 122, to one input of AND gate 110, enables data input to non-volatile memory 104 from the output of retroactive memory 100.

In operation, with the audio recorder 10 turned on, the system is in a quiescent listening mode. Controller 112 disables non-volatile memory 104 (main memory) via control signals 118. The microphone 12 and digital processing circuit 40 are active. Controller 112 activates the retroactive memory 100 via control signals 116. Compressed digital audio data samples at the output of digital processing circuit 40 are stored in the retroactive memory 100, which functions as a real time audio buffer.

In listening mode, new compressed digital audio data samples accumulate in retroactive memory 100. When the retroactive memory 100 is full, further input of additional compressed digital audio data samples causes the oldest stored compressed digital audio data sample to be beyond the data storage capacity of the retroactive memory 100, and be lost. Thus, retroactive memory 100 holds compressed digital audio data samples representing the most recent past audio reaching the tape recorder microphone 12. Typically, retroactive memory 100 holds the past 5 minutes of audio.

Normal recording mode is entered by pressing start button 14. Controller 112 conditions AND gate 108 to direct input digital data from the output of digital processing circuit 40 to main memory 104. The audio recorder begins recording current audio in real time. In normal recording mode, the recorder starts at present time and records present audio in the main memory module 104.

Retroactive recording mode is entered by pressing one of the retroactive recording control buttons, START A, 16, START B, 18 or start C, 20. As before, START A represents 1 minute, START B represents 3 minutes and START C represents 5 minutes. For START A, the past 1 minute of audio is transferred from retroactive memory 100 to main memory 104. Controller 112 initiates the transfer via control signals 116 and 118, and data control signal 122 to AND gate 110. For START B, the past 3 minutes of audio is transferred from retroactive memory 100 to main memory 104. For START C, the past 5 minutes of audio is transferred from retroactive memory 100 to main memory 104. After the data transfer of audio from retroactive memory 100 to main memory 104, new real time digital audio input data from digital processing circuit 40 is stored in main memory 104 at a real time rate.

The audio recorder is now at normal speed in a recording mode. However, as a result of using one of the retroactive recording start buttons, a portion of the audio which occurred prior to pushing the start button is recorded in the main memory 104. To playback the contents of the main memory 104, a digital to analog (D/A) converter would normally be required. For clarity, the audio playback functions in FIGS. 3, 4 and 5 are not shown.

The retroactive memory 100 and the main memory 104 used for audio recording in the audio recorder of FIG. 5 may be implemented using any one of a number of memory organizations. For example, the main memory 104 may be mounted on a memory module 102 which is removable by virtue of contact pins 114. Both the retroactive memory 100 and the main memory 104 may be included in a single memory, either on the same chip or in separate chips mounted on a single removable module 106. A removable module (102 or 106) simulates the convenience and transportability of magnetic tape cassettes I a solid state device.

Although the foregoing embodiments of the invention describe the storage and retroactive playback of audio information received from a microphone, a retroactive recorder in accordance with the present invention may also be configured to retroactively record video from a camera or data from other types of sensors, constituting any other type of information, such as serial data. However, the process is particularly compelling in the audio mode.

What is claimed is:

1. A recording method comprising:

sensing a source of information;

storing said information for a predetermined period of time in a memory to form a stored past interval of stored information;

sensing a user input command to record said past interval of stored information on a recording medium;

transferring, responsive to said step of sensing said user input command, at least a portion of said stored past interval of stored information from said memory to said recording medium;

selecting a portion of said past interval of stored information stored in said memory to form a selected portion; and transferring, responsive to said step of sensing a user input command, said selected portion of said past interval of stored information from said memory to said recording medium.

2. A recording method comprising:

sensing a source of information;

storing said information for a predetermined period of time in a memory to form a stored past interval of stored information;

sensing a user input command to record said past interval of stored information on a recording medium;

transferring responsive to said step of sensing said user input command, at least a portion of said stored past interval of stored information from said memory to said recording medium;

wherein said second memory is a magnetic tape memory, and wherein said step of transferring said stored past interval of stored information from said memory to said recording medium comprises transferring said stored past interval of stored information to said magnetic tape, by running said magnetic tape at a recording rate greater than the real time rate of said stored past interval of information.

3. A recorder comprising:

an sensor having an output for providing information;

a solid state memory coupled to said output of said sensor, said solid state memory being operated substantially continuously to store a predetermined interval of information from said sensor;

a main memory having a recording input;

a transfer circuit for transferring at least a portion of said predetermined interval of information stored in said solid state memory to said recording input of said main memory;

a user input control device for initiating the transfer of said portion of said predetermined interval of information from said solid state memory to said recording input of said main memory; and wherein said user input control device further comprises:

a user selection device which selects the magnitude of said portion of said predetermined interval of information for transfer from said solid state memory to said main memory.

4. A recorder apparatus in accordance with claim 3, wherein said user selection device comprises:

a plurality of buttons, each of said plurality of buttons corresponding to a respective predetermined magnitude of said portion of said predetermined interval of information stored in said solid state memory.

5. A recorder apparatus in accordance with claim 3, wherein said user input device comprises:

a button:

a counter for counting the number of times said button is pressed in a given time interval; and a selection circuit responsive to said counter for selecting for each respective count in said counter, a respective predetermined magnitude of said portion of said predetermined interval of information stored in said solid state memory.

6. A recording apparatus comprising:

means for sensing a source of information;

means for storing said information for a predetermined period of time in a memory to form a stored past interval of stored information;

means for sensing a user input command to record said past interval of stored information on a recording medium;

means for transferring, responsive to said means for sensing said user input command, at least a portion of said stored past interval of stored information from said memory to said recording medium;

means for selecting a portion of said past interval of stored information stored in said memory to form a selected portion; and means for transferring, responsive to said means for sensing a user input command, said selected portion of said past interval of stored information from said memory to said recording medium.

7. A recording apparatus comprising:

means for sensing a source of information;

means for storing said information for a predetermined period of time in a memory to form a stored past interval of stored information;

means for sensing a user input command to record said past interval of stored information on a recording medium; and means for transferring, responsive to said means for sensing said user input command, at least a portion of said stored past interval of stored information from said memory to said recording medium, wherein said recording medium is a magnetic tape, and wherein said means for transferring said stored past interval of stored information from said memory to said recording medium comprises means for transferring said stored past interval of stored information to said magnetic tape, by running said magnetic tape at a recording rate greater than the real time rate of said stored past interval of information.

* * * * *